(12) United States Patent
Guillot et al.

(10) Patent No.: US 7,924,061 B2
(45) Date of Patent: Apr. 12, 2011

(54) APPARATUS FOR DETECTING CLOCK FAILURE AND METHOD THEREFOR

(75) Inventors: Laurent Guillot, Seysses (FR); Kamel Abouda, Tournefeuille (FR); Pierre Turpin, Toulouse (FR)

(73) Assignee: Freescale Semiconductor, Inc., Austin, TX (US)

( * ) Notice: Subject to any disclaimer, the term of this patent is extended or adjusted under 35 U.S.C. 154(b) by 112 days.

(21) Appl. No.: 12/294,798

(22) PCT Filed: Mar. 27, 2006

(86) PCT No.: PCT/EP2006/004036
§ 371 (c)(1),
(2), (4) Date: Sep. 26, 2008

(87) PCT Pub. No.: WO2007/110099
PCT Pub. Date: Oct. 4, 2007

(65) Prior Publication Data
US 2010/0171528 A1  Jul. 8, 2010

(51) Int. Cl.
*H03K 5/19* (2006.01)
(52) U.S. Cl. .......................................................... 327/20
(58) Field of Classification Search .................... 327/20
See application file for complete search history.

(56) References Cited

U.S. PATENT DOCUMENTS

| | | |
|---|---|---|
| 5,438,328 A | 8/1995 | Kweon |
| 5,828,243 A | 10/1998 | Bagley |
| 5,867,041 A | 2/1999 | Ha |
| 5,946,362 A | 8/1999 | Ha |
| 6,204,711 B1 * | 3/2001 | Scarlett et al. ................. 327/291 |
| 6,282,210 B1 | 8/2001 | Rapport et al. |
| 6,326,830 B1 | 12/2001 | Brady et al. |
| 6,668,334 B1 | 12/2003 | Abel et al. |
| 7,106,118 B2 | 9/2006 | Tang et al. |
| 2003/0112906 A1 | 6/2003 | Pigott et al. |
| 2005/0198549 A1 | 9/2005 | Courant et al. |
| 2005/0206428 A1 | 9/2005 | Mondor |
| 2005/0241362 A1 | 11/2005 | Oberle et al. |

FOREIGN PATENT DOCUMENTS

| | | |
|---|---|---|
| DE | 4229539 A1 | 3/1994 |
| EP | 0440357 A | 8/1991 |
| WO | 2007110099 A1 | 10/2007 |

OTHER PUBLICATIONS

Notice of Allowance dated Oct. 18, 2010 in U.S. Appl. No. 12/294,799.

* cited by examiner

*Primary Examiner* — Lincoln Donovan
*Assistant Examiner* — Daniel Rojas

(57) ABSTRACT

A clock failure detection circuit comprises clock failure detection logic having a clock input providing an input clock signal, a counter and a reference clock input providing a reference clock signal to the counter for counting a number of reference clock cycles. The counter comprises a reset input arranged to receive successive reset pulses generated by at least one clock edge of the input clock signal to reset a counter value of the counter. The counter value before reset is used to identify a clock frequency error. A method of detecting a clock failure is also described. By using a counter value based on the reference clock cycles, and a reset trigger based on a clock edge of the input signal, it is possible to identify a clock frequency error in a much shorter time.

22 Claims, 4 Drawing Sheets

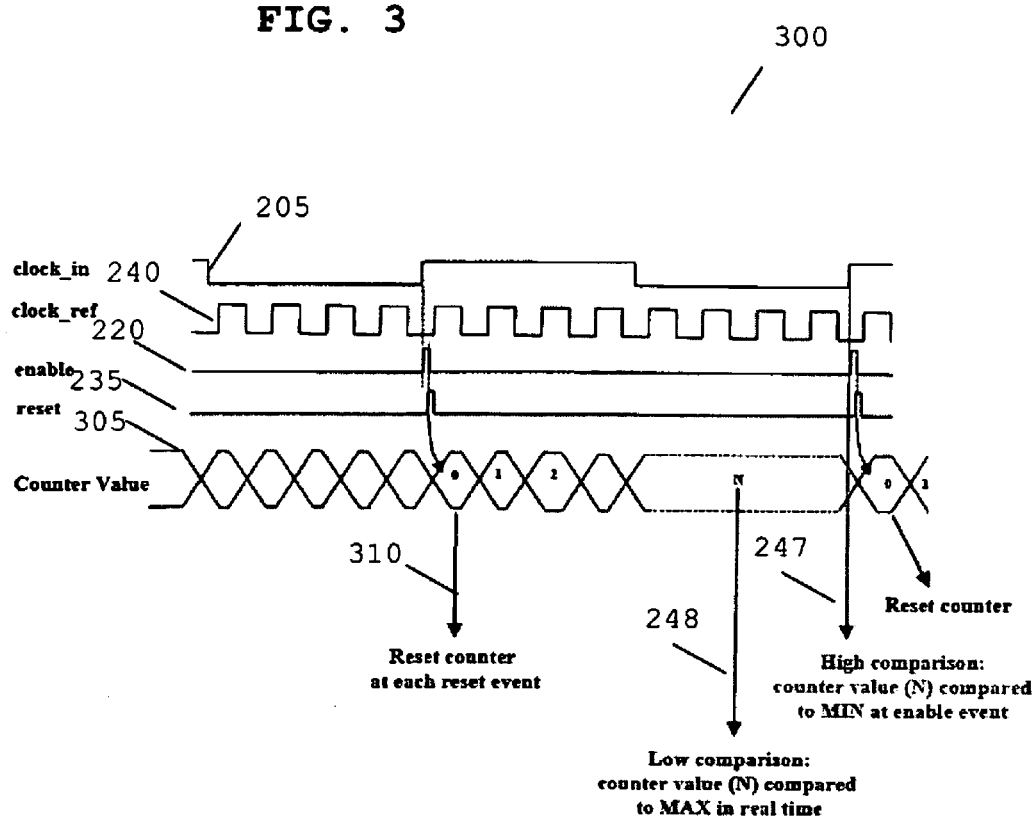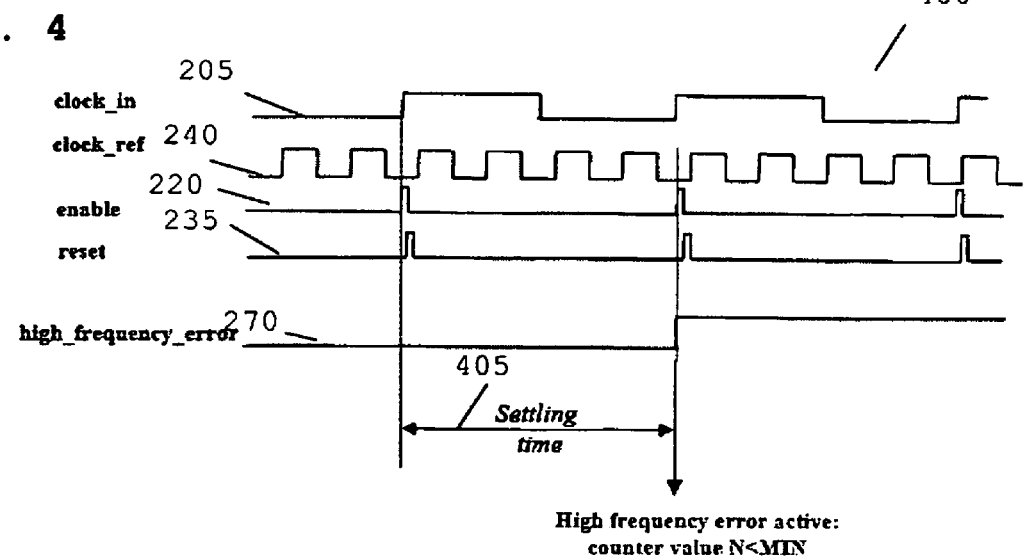

APPARATUS FOR DETECTING CLOCK FAILURE AND METHOD THEREFOR

FIELD OF THE INVENTION

The field of the present invention relates to a clock failure detection circuit and method for detecting a clock failure. The invention is applicable to, but not limited to, a microcontroller system.

BACKGROUND OF THE INVENTION

Many electronic products, such as computers, require accurate timing circuits to ensure that particular functions and operations are carried out at a specified time. In this regard, a key feature of many electronic products is a timing circuit that utilizes one or more accurate clock signals.

Typically, an accurate and reliable clock signal is difficult to guarantee, as the timing of clock circuits is known to vary with parameters, such as voltage, temperature, etc. Thus, many such products incorporate a clock failure detection circuit to detect when a clock signal fails. Such a failure may manifest itself by the clock producing irregular pulses, or by remaining too long at a particular high or low voltage level. Alternatively, the frequency of the clock signal (clock rate) may drift outside of tolerable limits. In such a situation, it is important to quickly detect such a malfunction, and implement a mechanism to correct the failure.

U.S. Pat. No. 5,946,362 describes a digital 'synchronous' circuit detecting a received clock frequency that is lower than a specified minimum value. The circuit described in U.S. Pat. No. 5,946,362 comprises a reference clock generator and a mechanism to compare clock edges of a generated clock signal with comparable clock edges of the reference clock signal. The circuit operates by counting clock edges of both the clock signal and the reference clock signal, and after a suitable lengthy period, a comparison of the counter values of the two clock signals is performed, to determine whether the generated clock signal is misaligned from the reference clock signal by an amount that is lower than a specified minimum error.

U.S. Pat. No. 5,828,243 describes a digital asynchronous system for detecting whether a received clock frequency matches a specified clock frequency. U.S. Pat. No. 5,828,243 discloses a clock failure detection circuit that monitors a clock by comparing the clock to at least one delayed version of itself is provided. The original clock and the delayed version will be offset, such that an edge of one of either the original clock or the delayed version can clock a logic circuit to determine if the clock is at the correct level. By setting up the delay so that a clock edge is generated when the clock signal should be low, for instance, an output signal in error will be provided whenever the clock is high. Thus, this error could be caused by the clock being stuck high, or by an irregular pulse width.

Basically, the same technique is applied in U.S. Pat. No. 5,828,243 as is performed in U.S. Pat. No. 5,946,362, albeit that an internal high frequency reference clock is not needed in U.S. Pat. No. 5,828,243 as it is an 'asynchronous' system (versus the 'synchronous' operation of U.S. Pat. No. 5,946,362). In this regard, an asynchronous system may be distinguished from a synchronous system in that the decision of a clock failure (or clock error) and any subsequent clock reset operation is not dependent upon a reference clock.

Thus, the known prior art techniques require a significant delay before a clock error can be determined, i.e. sufficient to enable counters incremented over multiple clock pulses to reach a particular value and a comparison of the counter values used to highlight that respective values are unequal. Furthermore, the known prior art techniques teach monitoring whether a clock signal has fallen below a specified clock rate.

Thus, a need exists for an improved clock failure detection circuit, associated microcontroller system and method of operation therefor.

SUMMARY OF THE INVENTION

In accordance with aspects of the present invention, there is provided a clock failure detection circuit, an integrated circuit, a microcontroller system and method of operation as defined in the appended Claims.

BRIEF DESCRIPTION OF THE DRAWINGS

Exemplary embodiments of the present invention will now be described, by way of example only, with reference to the accompanying drawings, in which:

FIG. 3 illustrates a timing circuit used in accordance with embodiments of the present invention;

FIG. 4 illustrates a timing circuit used in accordance with embodiments of the present invention;

DESCRIPTION OF EMBODIMENTS OF THE INVENTION

Figure 1:
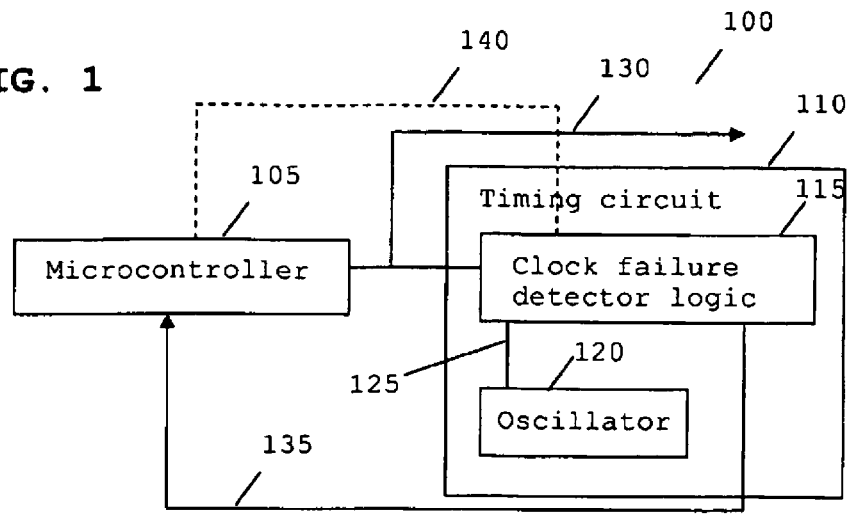
FIG. 1 illustrates a microcontroller circuit that can be adapted in accordance with embodiments of the present invention.

One embodiment of the present invention describes a clock failure detection circuit comprising clock failure detection logic having a clock input providing an input clock signal, a counter, and a reference clock input providing a reference clock signal to the counter for counting a number of reference clock cycles. The counter comprises a reset input arranged to receive successive reset pulses generated by at least one clock edge of the input clock signal to reset a counter value of the counter wherein the counter value before reset is used to identify a clock frequency error.

Thus, and advantageously, the provision of a counter value based on the reference clock cycles, and a reset trigger based on a clock edge of the input signal, it is possible to identify a clock frequency error in a much shorter time than waiting for multiple input clock cycles to detect a clock failure.

clock failure detection circuit is such that the logic may identify whether the clock frequency error is outside of a range, for example whether a higher limit of a clock frequency error is exceeded or a lower limit of the input clock frequency error is not reached.

In one embodiment of the present invention, the clock failure detection logic is arranged to identify whether the clock frequency error is outside of a clock operation range wherein the clock operation range includes a higher limit of a clock frequency error and/or a lower limit of the input clock frequency error.

This is in contrast to the known techniques of identifying whether the clock rate has fallen below a threshold.

In one embodiment of the present invention, a reset pulse may be generated in each duty cycle of the input clock signal such that a clock frequency error can be identified within a single clock period of the input clock signal.

In one embodiment of the present invention, an output of the counter may be latched when the counter reaches a value outside of the range between successive reset pulses, thereby providing an error signal.

Advantageously, the reset pulses enable the counter to reset and a clock failure to be detected in a rapid manner, for example within a single input clock period.

In one embodiment of the present invention, the counter comprises two outputs wherein a first output transmits an error signal when a high frequency clock error limit may be activated when the counter fails to reach a minimum value between successive reset pulses, and a second output transmits an error signal when a low frequency clock error limit may be activated when the counter exceeds a maximum value between successive reset pulses.

Thus, and advantageously, the provision of two separate outputs to identify whether the counter fails to reach a minimum value or the counter exceeds a maximum value between successive reset pulses enables a clock failure to be detected in a rapid manner.

In one embodiment of the present invention, the counter may be operably coupled to at least one latch arranged to latch a clock error signal in response to an enable signal.

In one embodiment of the present invention, the input clock signal may be input to a first input of a first NAND logic gate and a first delay, such that an output of the first delay is input to a second inverted input of the first NAND logic gate. In this manner, and advantageously, an output of the first NAND logic gate may provide a short enable pulse to be applied to a latch in order to latch a clock error signal from the counter.

In one embodiment of the present invention, the enable pulse comprises a pulse width equal to the first delay. In this manner, and advantageously, by provision of a defined delay, the enable pulse width can be controlled.

In one embodiment of the present invention, the input clock signal delayed by the first delay is subsequently input to a first input of a second NAND logic gate and a second delay. An output of the second delay is input to a second inverted input of the second NAND logic gate. In this manner, and advantageously, an output of the second NAND logic gate may provide a reset pulse for resetting the counter.

In one embodiment of the present invention, the reset pulse comprises a pulse width equal to the second delay. In this manner, and advantageously, by provision of a second defined delay, the reset pulse width can be controlled.

In one embodiment of the present invention, the clock failure detection logic may be arranged to generate an enable pulse and/or a reset pulse upon each rising and trailing edge of the input clock signal.

In this manner, and advantageously, a comparator may be arranged to compare time periods between successive enable pulses or reset pulses to identify whether a clock failure is in response to a misaligned clock duty cycle.

In one embodiment of the present invention, the clock failure detection circuit may be applied to an asynchronous digital detection of clock signal failure.

In one embodiment of the present invention, an integrated circuit may be configured to comprise the aforementioned clock failure detection circuit.

In one embodiment of the present invention, a method of detecting a clock failure comprises providing an input clock signal; providing a reference clock signal to a counter; and counting a number of reference clock cycles of the reference clock signal. The method further comprises generating successive reset pulses using at least one clock edge of the input clock signal; receiving successive reset pulses at the counter to reset a counter value; and identifying a clock frequency error based on the counter value before reset.

One embodiment of the present invention will be described in terms of a microprocessor system employing a clock failure detection circuit. However, it will be appreciated by a skilled artisan that the inventive concept herein described may be embodied in any type of circuit that employs a clock.

Referring now to FIG. 1, a based microcontroller circuit 100, adapted in accordance with embodiments of the present invention, is illustrated. The circuit 100 comprises a microcontroller 105 operably coupled to a timing circuit 110. The timing circuit 110 comprises an oscillator 120 that provides a reference clock signal 125 to clock failure detection logic 115. The microcontroller 105 is configured to program minimum and maximum failure values in the clock failure detection logic 115 via control line 140. The microcontroller 105 also provides an external clock 130 to the timing circuit 110 and other components (not shown) within the system. The clock failure detector logic is also operably coupled to the microcontroller 105 via a serial-parallel interface (SPI) 135, which is used for example to report faults such as a microcontroller interruption.

Figure 2:
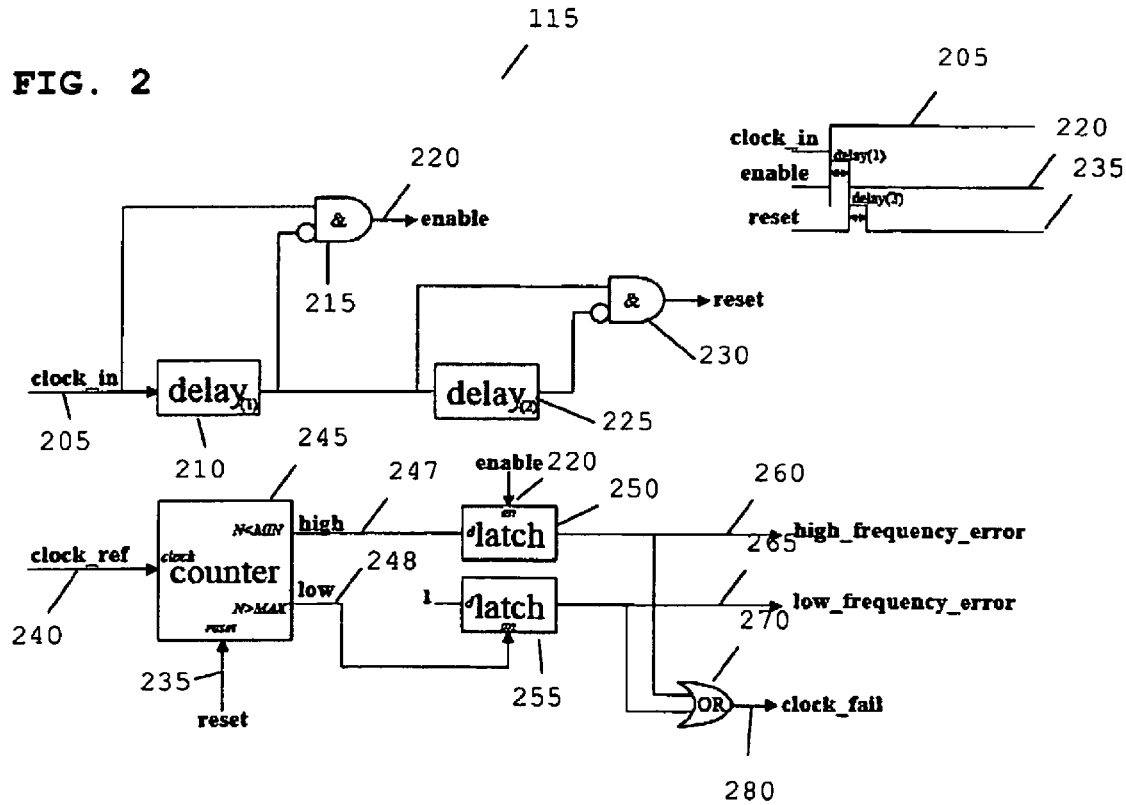
FIG. 2 illustrates clock failure detection logic supporting embodiments of the present invention.

Referring now to FIG. 2 clock, failure detection logic 115, according to embodiments of the present invention, is illustrated. An input clock signal 205 is input to both a first delay 210 and one input of a AND logic gate 215. The first delay 210 provides a very small defined delay of the input clock signal 205 and outputs the delayed clock signal to the inverted input of the AND logic gate 215. Thus, in this manner, the AND logic gate 215 outputs a short duration pulse 220 of pulse width equal to the first delay. This short pulse 220 is hereinafter referred to as an 'enable' signal.

The output from the first delay 210, namely the delayed input clock signal, is input to both a second defined delay 225 and one input of a second AND logic gate 230. The second defined delay 225 provides a further very small second delay of the delayed input clock signal and outputs the further delayed clock signal to the inverted input of the second AND logic gate 230. Thus, in this manner, the second AND logic gate 230 also outputs a delayed short duration pulse 235 of pulse width equal to the second delay 225. This second short pulse 235 is hereinafter referred to as a 'reset' signal.

Thus, in one embodiment, say for high frequency detection, two pulses are generated on a rising edge of a clock input. In one embodiment of the present invention, the two pulses may be generated to comprise the same pulse width, with the start of the first pulse delayed by a pulse width from the start of the second pulse. The first 'enable' pulse may be used for latching a bit from a counter indicative of a frequency violation (for example whether a high frequency error is detected if the counter value is less than or equal to N_Min).

The second pulse is used to reset the counter, thereby generating a new detection window, notably for a detection window of one external period clock from rising edge to rising edge. Notably, in one embodiment the second pulse is generated with the same flip-flops that are used to latch information, to ensure that the pulse width that is generated is equal to a transition time of the flip-flop (and any combinatory logic). The transition time is typically higher than the reset pulse width, or the latch enable pulse width, which therefore track PVT variations accurately.

The clock failure detection logic 115 comprises a counter 245 receiving a reference clock signal 240. The counter 245 is provided with the aforementioned reset pulse 235. The counter 245 comprises two threshold limits, namely N_Max and N_Min.

When the counter 245 counts a value for 'N' that is greater than N_Max, a signal is output on a 'low output' line 248.

Similarly, when the counter 245 counts a value for 'N' that is less than N_Min, a signal is output on a 'high output' line 247. The signal is indicative that a high frequency error is detected. The 'high output' line 247 is input to a first latch 250, with any signal residing on the 'high output' line 247, thus being latched out of the first latch 250 by the aforementioned enable signal 220. The signal may, thus in one embodiment of the present invention, be double latched and reported on a serial-to-parallel interface (SPI) (not shown), for example. After a correct read operation of the SPI, the first latch 250 is unlatched if the signal (error) is removed. Thus, in operation, if there are not enough rising clock edges in a given time frame, as dictated by the counter threshold values, the first latch 250 will reset and cause an error signal on the 'high output' line 247.

Similarly, the 'low output' line 248 is input to a second latch 255. The second latch 255 comprises a logic '1' input, which is latched out of the second latch 255 by any signal residing on the 'low output' line 248.

The signal latched out of the first latch 250 is indicative of a high frequency error signal 260. The signal latched out of the second latch 255 is indicative of a low frequency error signal 265. Both of these signals, namely the high frequency error signal 260 and low frequency error signal 265, may be input to an XOR logic gate 270, which outputs a clock failure signal 280, should there be either a high frequency error 260 or a low frequency error 265.

Thus, for low frequency detection, a re-triggerable latch (otherwise known as a mono-flop) is used, which in some embodiments of the present invention is triggered with each (i.e. both leading and trailing) clock edge. Thus, such embodiments of the present invention that utilise both leading and tracking clock edges in incrementing a clock counter value can be used to detect duty cycle failure. In this manner, enable and reset pulses are generated on both the rising and falling edges of the clock_in signal 205, in contrast to using only the rising clock edge.

Thus, one embodiment of the present invention comprises counting on both rising and trailing edges. In this regard, it is possible to identify whether a clock failure is due to a failure of the clock source to generate a reliable clock duty cycle. That is, by calculating a distance between enable/reset pulses that are generated by both rising and trailing clock edges, the circuit may be arranged to determine a first time period for a high portion of the clock pulse as well as a second time period for a low portion of the clock pulse. Thus, if the time periods are determined using a counter value, the circuit may be able to provide an indication of whether the clock provides a reliable duty cycle by comparing counter values for the high portion and low portion of the clock signal.

In embodiments of the present invention, when precise high frequency error detection with a high frequency range limit is required, such a clock error may be detected with a defined increase in the N_Min value. This 'defined' embodiment advantageously enables the clock failure detection logic to work with an internal clock that is at a minimum N_Min times higher (or N_Min/2 times higher if counting on both edges) than the high frequency limit required.

Thus, embodiments of the present invention provide an asynchronous digital range frequency detector. In effect, embodiments of the present invention provide a type of digital hysteretic comparator with both low and high frequency detection.

A maximum external high frequency error detection of the aforementioned asynchronous principle depends only on the duration of the first delay 210 plus the duration of the second delay 225. The duration of the delays depends upon the flip-flop technology, for example setup/hold and transition times.

To have less than or equal to 10%, N_Min must be greater than or equal to '10'. For example, to detect a minimum of a higher frequency error of a clock running at 50 MHz with an accuracy of 10% (i.e. a clock frequency of 55 MHz would lead to an error signal), a reference clock of at least 500 MHz is used.

Thus, embodiments of the present invention may be employed in a purely asynchronous digital circuit, independent of the silicon/manufacturing process used due to the duration of each delay are depending to electrical parameters of the flip-flop. For that, the inventive concept of the present invention is perfectly portable (for example, for use in field programmable gate array (FPGA) applications).

Referring now to FIG. 3, a timing circuit 300 according to embodiments of the present invention is illustrated. An input clock frequency 205 is shown at a first clock rate, which is lower than the reference clock frequency 240. In accordance with embodiments of the present invention, when the rising edge of the input clock frequency 205 is misaligned with the rising edge of the reference clock frequency 240, an enable signal 220 is generated, with a pulse width dictated by the first delay (say, 210 in FIG. 2). Subsequently, a reset pulse 235 is generated, with a pulse width dictated by the second delay (say, 225 in FIG. 2).

As illustrated, a counter 305 is reset 310 upon each generation of the reset signal and this may then be applied to the counter, say counter 245 of FIG. 2. FIG. 3 illustrates a timing position where a reset signal may prevent the counter 'N' to pass an N_Min value at an enable event (i.e. generation of an enable signal). Thus, a high frequency error 260 of the clock signal is therefore detected, and the subsequent reset pulse re-initialises the counter.

Referring now to FIG. 4 timing circuit 400 in accordance with embodiments of the present invention is illustrated. An input clock frequency 205 is shown at a first clock rate, which is significantly lower than the reference clock frequency 240. Again, in accordance with embodiments of the present invention, when the rising edge of the input clock frequency 205 is misaligned with the rising edge of the reference clock frequency 240, an enable signal 220 is generated, with a pulse width dictated by the first delay (say, 210 in FIG. 2). Subsequently, a reset pulse 235 is generated, with a pulse width dictated by the second delay (say, 225 in FIG. 2). A significant advantage of embodiments of the present invention can be seen in that a determination of whether a clock failure exists can be made within one clock cycle 405 of the input clock 205.

Figure 5:
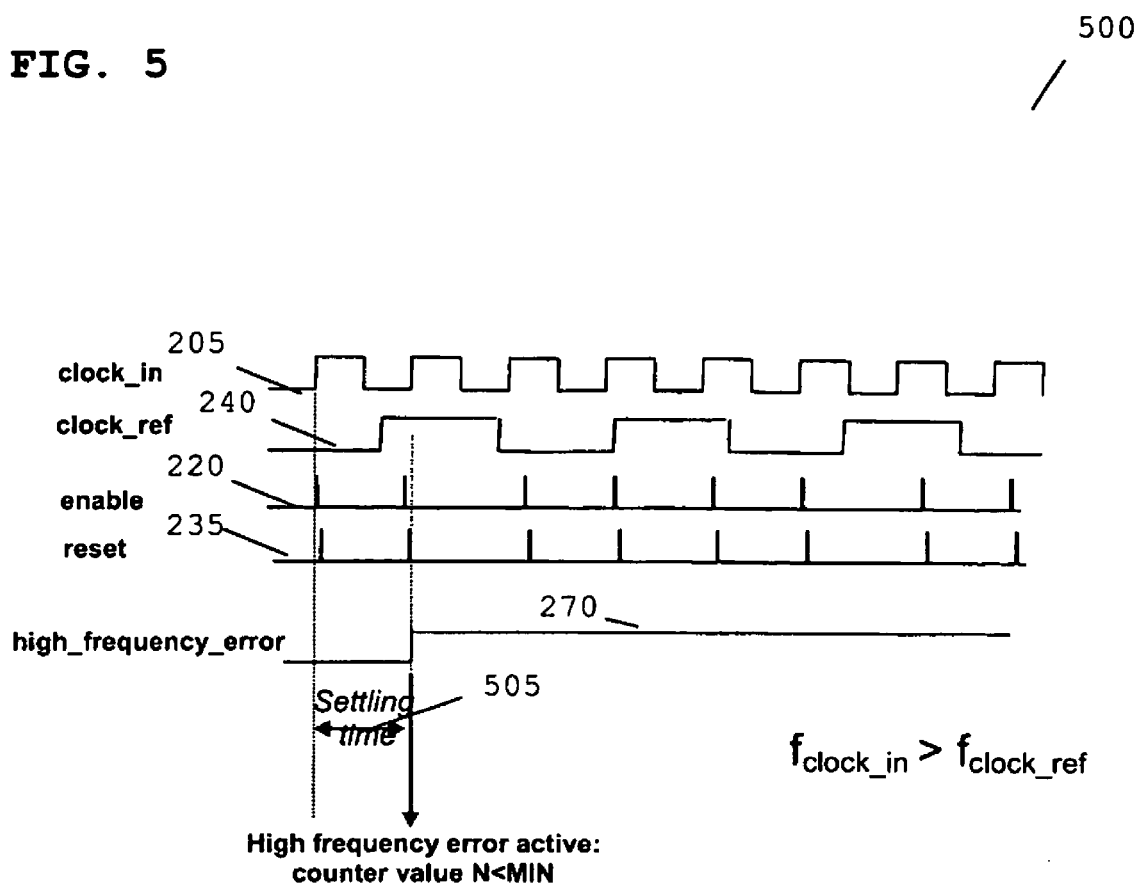
FIG. 5 illustrates a timing circuit to detect a clock frequency error operating at a higher frequency than a reference clock, in accordance with embodiments of the present invention.

Referring now to FIG. 5 a timing circuit 500, in accordance with embodiments of the present invention is illustrated. An input clock frequency 205 is shown at a first clock rate, which is higher than the reference clock frequency 240. Again, in accordance with embodiments of the present invention, when the rising edge of the input clock frequency 205 is misaligned with the rising edge of the reference clock frequency 240, an enable signal 220 is generated, with a pulse width dictated by the first delay (say, 210 in FIG. 2). Subsequently, a reset pulse 235 is generated, with a pulse width dictated by the second delay (say, 225 in FIG. 2). A significant advantage of embodiments of the present invention can be seen in that a determination of whether a clock failure exists, when the external clock rate is higher than the reference clock frequency 240, can be made within one clock cycle 505 of the input clock 205.

Figure 6:
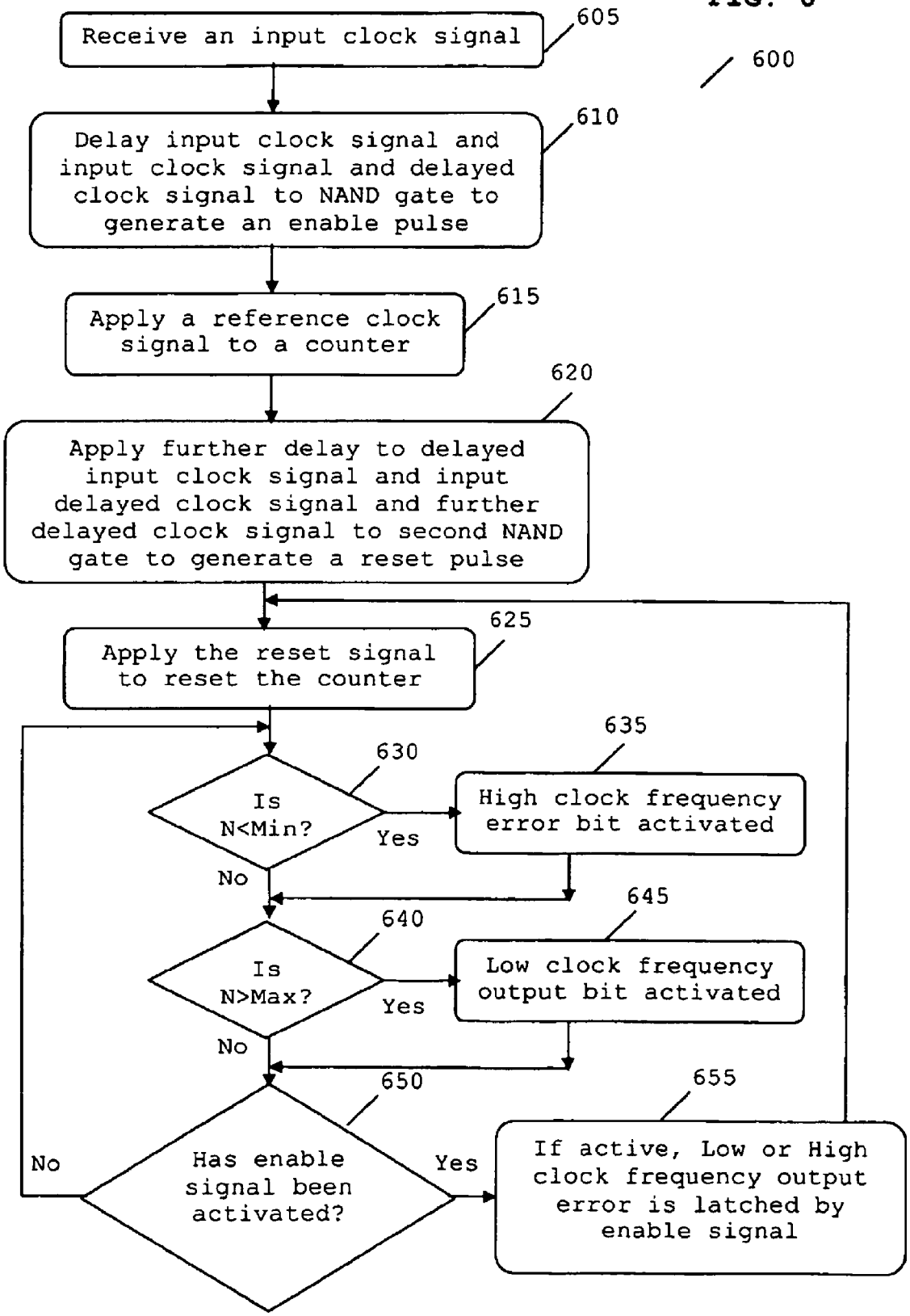
FIG. 6 illustrates a flowchart identifying a method of operation in accordance embodiments of the present invention.

Referring now to FIG. 6, a flowchart 600 illustrates a method of identifying a clock failure in accordance with embodiments of the present invention. An input clock signal is received in step 605. The received input clock signal is input to both a first delay and one input of a NAND logic gate. The delayed clock signal is input to an inverted input of the NAND logic gate, as shown in step 610, in order to generate an enable pulse.

A reference clock signal is input to a counter in step 615. The delayed input clock signal is input to both a second delay and one input of a second NAND logic gate. The second delay provides a further delay of the delayed input clock signal and outputs the further delayed clock signal to the inverted input of the second NAND logic gate, as shown in step 620, to generate a 'reset' signal.

The reset signal is applied to a counter, to reset the counter value 'N', in step 625. The counter may comprise at least two outputs. A first output may be configured to identify that a high clock frequency error bit is activated, in step 635, in response to determining that the counter value 'N' is less than a minimum counter value 'Min', in step 630.

Similarly, a second output may be configured to identify that a low clock frequency error bit is activated, in step 645, in response to determining that the counter value 'N' is greater than a maximum counter value 'Max', in step 640.

A determination, is then made as to whether the enable signal has been activated, in step 650. If the enable signal has not been activated, in step 650, the process loops back to step 630. If the enable signal has been activated, in step 650, any active low or active high logic value frequency on an output of the counter is latched out of the clock failure detection logic by the enable signal, as shown in step 655. A subsequent reset signal is then applied to the counter, to reset the counter value, as shown in step 625.

It will be understood that the improved clock failure detection circuit, and method of operation therefor, as described above, aims to provide at least one or more of the following advantages:

(i) Embodiments of the invention are able to detect a clock frequency error operating at a higher frequency than the reference clock.

(ii) Embodiments of the invention are able to detect a clock failure when the input clock frequency drifts outside of a specified range, in contrast to the prior art techniques of detecting whether the input clock falls below a fixed-point minimum clock frequency.

(iii) Embodiments of the invention provide an innovative auto reset and latch pulse circuit that dynamically adapts according to variation in temperature, voltage supply and process.

(iv) The principle can also be used to detect duty cycle error of clock input, if the detection is arranged to use both rising and falling edges of the clock pulse.

(v) Embodiments of the invention are able to detect clock failure independent of the silicon/manufacturing process used.

In particular, it is envisaged that the aforementioned inventive concept can be applied by a semiconductor manufacturer to any timing circuit, for example those of the Freescale™ Microcontroller family of devices. Furthermore, it is envisaged that, for example, a semiconductor manufacturer may employ the inventive concept in a design of a stand-alone device, such as an integrated circuit providing timing/clock signals or an application-specific integrated circuit (ASIC) and/or any other sub-system element.

It will be appreciated that any suitable distribution of functionality between different logic gates or elements may be used without detracting from the inventive concept herein described. Hence, references to specific functional devices or elements are only to be seen as references to suitable means for providing the described functionality, rather than indicative of a strict logical or physical structure or organization.

Aspects of the invention may be implemented in any suitable form including hardware, software, firmware or any combination of these. The elements and components of an embodiment of the invention may be physically, functionally and logically implemented in any suitable way. Indeed, the functionality may be implemented in a single unit or IC, in a plurality of units or ICs or as part of other functional units.

Although the present invention has been described in connection with some embodiments, it is not intended to be limited to the specific form set forth herein. Rather, the scope of the present invention is limited only by the accompanying claims. Additionally, although a feature may appear to be described in connection with particular embodiments, one skilled in the art would recognize that various features of the described embodiments may be combined in accordance with the invention. In the claims, the term 'comprising' does not exclude the presence of other elements or steps.

Furthermore, although individual features may be included in different claims, these may possibly be advantageously combined, and the inclusion in different claims does not imply that a combination of features is not feasible and/or advantageous. Also, the inclusion of a feature in one category of claims does not imply a limitation to this category, but rather indicates that the feature is equally applicable to other claim categories, as appropriate.

Furthermore, the order of features in the claims does not imply any specific order in which the features must be performed and in particular the order of individual steps in a method claim does not imply that the steps must be performed in this order. Rather, the steps may be performed in any suitable order. In addition, singular references do not exclude a plurality. Thus, references to "a", "an", "first", "second" etc. do not preclude a plurality.

Thus, an improved clock failure detection circuit, integrated circuit therefor and method of detecting a clock failure have been described, wherein the aforementioned disadvantages with prior art arrangements have been substantially alleviated.

The invention claimed is:

1. A clock failure detection circuit comprises:
   clock failure detection logic comprising a clock input, reset logic, and a counter, the clock input to receive an input clock signal;
   the counter comprising a reference clock input to receive a reference clock signal, the counter to count a number of cycles of the reference clock, the counter is coupled to the reset logic arranged to generate a successive reset pulse in each duty cycle of the input clock signal based on at least one clock edge of each duty cycle of the input clock signal, and each successive reset pulse to reset a counter value of the counter, wherein the counter value before reset is used to allow a clock frequency error within a single clock period of the input clock signal to be identified.

2. The clock failure detection circuit of claim 1, wherein the clock failure detection logic is further arranged to identify whether the clock frequency error is outside of a clock operation range, wherein the clock operation range includes a higher limit of a clock frequency error, a lower limit of the clock frequency error, or both the higher limit and the lower limit.

3. The clock failure detection circuit of claim 1, wherein the counter comprises at least one output to provide an error signal in response to the counter reaches a value between successive reset pulses outside of a counter range representative of the clock operation range.

4. The clock failure detection circuit of claim 1, wherein the counter comprises two outputs, wherein a first output is to provide an error signal in response to a high frequency clock error limit being activated based upon the counter failing to reach a minimum value between successive reset pulses, and a second output is to provide an error signal in response to a low frequency clock error limit being activated based upon the counter exceeding a maximum value between successive reset pulses.

5. The clock failure detection circuit of claim 1, wherein the counter is further coupled to at least one latch arranged to latch a clock error signal in response to an enable signal generated by enable logic coupled to the at least one latch.

6. The clock failure detection circuit of claim 5 wherein the clock error signal, generated in response to a low frequency clock error limit being exceeded, latches an error bit from the at least one latch.

7. The clock failure detection circuit of claim 1 wherein the clock failure detection logic comprises a first NAND logic gate to receive the input clock signal and a first delay element to receive the input clock signal, such that an output signal of the first delay element is provided to a second inverted input of the first NAND logic gate, and an output of the first NAND logic gate is to provide an enable pulse to latch a clock error signal from the counter.

8. The clock failure detection circuit of claim 7 wherein the enable pulse comprises a pulse width equal to the first delay.

9. The clock failure detection circuit of claim 7 wherein the clock failure detection logic comprises a second NAND logic gate coupled to a second delay element such that the output signal of the first delay element is provided to a first input of the second NAND logic gate.

10. The clock failure detection circuit of claim 9 wherein an output signal of the second delay element is to be provided to a second inverted input of the second NAND logic gate, and an output of the second NAND logic gate is to provide a reset pulse for resetting the counter.

11. The clock failure detection circuit of claim 10 wherein the reset pulse comprises a pulse width equal to a delay of the second delay element.

12. The clock failure detection circuit of claim 7 wherein the clock failure detection logic is arranged to generate an enable pulse, a reset pulse, or both an enable pulse and a reset pulse upon each rising and trailing edge of the input clock signal.

13. The clock failure detection circuit of claim 7 wherein the clock failure detection logic comprises a comparator that is arranged to compare time periods between successive enable pulses or reset pulses to identify whether a clock failure is in response to a misaligned clock duty cycle.

14. A method of detecting a clock failure comprising:
providing an input clock signal;
providing a reference clock signal to a counter;
counting a number of reference clock cycles of the reference clock signal;
generating a successive reset pulse in each corresponding duty cycle of the input clock signal using at least one clock edge of the input clock signal;
receiving the successive reset pulses at the counter to reset a counter value; and
identifying a clock frequency error within a single clock period of the input clock signal based on the counter value before reset.

15. The method of claim 14 further comprising:
identifying whether the clock frequency error is outside of a clock operation range wherein the clock operation range includes a higher limit of a clock frequency error and a lower limit of the input clock frequency error.

16. The method of claim 14 further comprising:
providing an error signal, in response to the counter reaching a value outside of the clock operation range between successive reset pulses.

17. The method of claim 16 wherein providing the error signal further comprises:
providing the error signal in response to a high frequency clock error limit being detected in response to the counter failing to reach a minimum value between successive reset pulses; or
providing the error signal in response to a low frequency clock error limit being detected in response to the counter reaching a maximum value between successive reset pulses.

18. The method of claim 14 further comprising: latching out a clock error signal in response to an enable signal.

19. The method according to claim 14 further comprising:
inputting the input clock signal to a first input of a first NAND logic gate and a first delay;
inputting an output of the first delay to a second inverted input of the first NAND logic gate; and
providing an enable pulse from an output of the first NAND logic gate to latch a clock error signal from a counter.

20. The method according to claim 19 further comprising:
inputting a delayed input clock signal to a first input of a second NAND logic gate and a second delay;
inputting an output of the second delay to a second inverted input of the second NAND logic gate; and
providing a reset pulse from an output of the second NAND logic gate for resetting the counter.

21. The method according to claim 14 further comprising:
generating at least one of an enable pulse, a reset pulse, or both a reset pulse and an enable pulse upon each corresponding rising and trailing edge of the input clock signal.

22. The method according to claim 21 further comprising comparing time periods between at least one of successive enable pulses or between success reset pulses to identify a misaligned clock duty cycle.

* * * * *